United States Patent
Elian et al.

(10) Patent No.: US 6,703,190 B2
(45) Date of Patent: Mar. 9, 2004

(54) METHOD FOR PRODUCING RESIST STRUCTURES

(75) Inventors: Klaus Elian, Erlangen (DE); Stefan Hien, Austin, TX (US); Ernst-Christian Richter, Erlangen-Bruck (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/164,550

(22) Filed: Jun. 7, 2002

(65) Prior Publication Data

US 2003/0008240 A1 Jan. 9, 2003

Related U.S. Application Data

(63) Continuation of application No. PCT/DE00/04237, filed on Nov. 27, 2000.

(30) Foreign Application Priority Data

Dec. 7, 1999 (DE) .......................... 199 58 966

(51) Int. Cl.$^7$ ................................. G03C 5/00
(52) U.S. Cl. .................... 430/324; 430/296; 430/270.1; 430/281.1; 430/910; 430/926; 430/326; 430/324; 430/330; 430/921; 430/923
(58) Field of Search .............................. 430/296, 270.1, 430/281.1, 910, 926, 330, 326, 324, 921, 923

(56) References Cited

U.S. PATENT DOCUMENTS

| | | | |
|---|---|---|---|
| 5,234,793 A | | 8/1993 | Sebald et al. |
| 5,851,733 A | * | 12/1998 | Sezi et al. .................. 430/311 |
| 6,251,558 B1 | * | 6/2001 | Elian et al. ............... 430/270.1 |

FOREIGN PATENT DOCUMENTS

| | | | | |
|---|---|---|---|---|
| DE | 42 26 464 A1 | 2/1994 | | |
| EP | 0 395 917 A2 | 11/1990 | | |
| EP | 0 425 142 A2 | 5/1991 | | |
| EP | 874281 A1 | * 10/1998 | ........... | G03F/7/004 |
| EP | 0 919 867 A2 | 6/1999 | | |
| JP | 07 261 393 | 10/1995 | | |

OTHER PUBLICATIONS

E. Reichmanis et al.: "Chemically Amplified Resists: Chemistry and Processes", *Advanced Materials for Optics and Electronics*, vol. 4, 1994, pp. 83–93.

Hiroshi Ito: "Deep–UV resists: Evolution and status", *Solid State Technology*, Jul. 1996, pp. 164–166, 168, and 170.

* cited by examiner

*Primary Examiner*—Mark F. Huff
*Assistant Examiner*—Daborah Chacko-Davis
(74) *Attorney, Agent, or Firm*—Laurence A. Greenberg; Werner H. Stemer; Ralph E. Locher

(57) ABSTRACT

A method for creating negative resist structures is described. In the method, a chemically fortified resist is applied to a substrate, dried, irradiated with light, x-ray, electron or ion beams, heated, developed using a aqueous-alkaline developer solution and siliconized from a liquid phase. The resist contains the following constituent: a polymer, whose polarity is modified by acidic action and which contains carboxylic acid anhydride groups, preferably in latent form; a compound which releases an acid as a result of thermal treatment; a photoreactive compound, from which a base is created during the irradiation with light, x-ray, electron or ion beams; a solvent; and optionally one or more additives.

15 Claims, No Drawings

METHOD FOR PRODUCING RESIST STRUCTURES

CROSS-REFERENCE TO RELATED APPLICATION

This application is a continuation of copending International Application No. PCT/DE00/04237, filed Nov. 27, 2000, which designated the United States and was not published in English.

BACKGROUND OF THE INVENTION

Field of the Invention

The invention relates to a process for producing negative resist structures.

In microelectronics, resists known as chemical amplification resists (CAR) are widely used for a variety of lithographic technologies (see Solid State Technology, vol. 39 (1996), No. 7, pages 164 to 173). The principle of chemical amplification is employed both for wet-developable single-layer resists and for two-layer resist systems which can be developed wholly or partly under dry conditions. The resists may operate in accordance with the principle of acid-catalytic cleavage. In the case of positive-working resists, in a heating step (heat treatment) a polar carboxylic acid group is formed from an apolar chemical group, such as a tert-butyl carboxylate group, in the presence of an acid generated photolytically. Further examples of "blocked" groups of this kind are tert-butoxycarbonyloxy groups (t-BOC groups) and acetal groups. In the case of development in an aqueous-alkaline developer, the change in polarity is then used for selectively dissolving the exposed (polar) areas.

In the case of negative chemical amplification resists that can be developed in aqueous alkalis, exposure likewise produces a strong acid, from a photoacid generator. In this case, however, in the heating step that follows exposure, the acid that is produced serves not to eliminate "blocked" groups (as in the case of the positive resists) but instead for the acid-catalyzed cross-linking of the resist base polymers, commonly in the presence of suitable cross-linking agents. Acid-cleavable "blocked" groups on the polymer are therefore not needed with these resists.

A negative chemical amplification resist that does not operate on the basis of cross-linking is known from U.S. Pat. No. 4,491,628. In this case a resist system is used which is composed of the same components as the positive chemical amplification resists described above. The negative image of the mask is brought about by using, instead of the aqueous-alkaline developer that dissolves out the polar areas of the resist, an organic developer that selectively dissolves out the apolar (unexposed) areas. A disadvantage here exists, however, in the use of organic solvents as developers (toxicity, flammability, disposal). Developers of this kind are not accepted in semiconductor applications.

Otherwise, like negative chemical amplification resists, the positive chemical amplification resists have been known for a long time (see, for example: Advanced Materials for Optics and Electronics, vol. 4 (1994), pages 83 to 93).

One specific variant of a positive resist is known from Published, Non-Prosecuted German Patent Application DE 42 26 464 A. This dry-developable resist is based on the chemical combination of a photobase generator with a thermoacid generator, as a result of which the unexposed areas of the solid resist film are modified in that, in a chemical reaction step following exposure, silicon molecules can be installed in the near-surface area of the resist film. In the processing operation, the otherwise customary wet-chemical developing step is omitted. Instead, the latent structures produced in the course of exposure are generated by direct siliconization and subsequent etching in an oxygen plasma (top surface imaging, TSI). A disadvantage here is that, owing to acid-base diffusion processes within the resist and also by diffusion of the siliconizing agent, the edges of the structure following siliconization are not clearly defined. After the final oxygen etching process, this results in high edge roughness and in particular to a limitation on the resolving power. Future lithographic generations with a required resolution of <150 nm can therefore not be realized in this way.

In a process known from European Patent EP 0 395 917 B for widening photoresist structures, a specific kind of positive resist system is used which can be developed by aqueous alkali. In this case the base polymer used in the resist contains reactive groups. These groups allow the developed resist structure to be after treated with appropriate reagents. In the course of the after treatment, the structures are "widened" (chemical amplification of resist lines, CARL) and the resist valleys and holes are narrowed.

In accordance with a process known from U.S. Pat. No. 5,234,793, the after treatment is utilized for siliconization in a two-layer resist system (Si-CARL). However, this kind of after treatment cannot be carried out if the polymer matrix is cross-linked in the developed resist structure. Negative resists that operate on the basis of cross-linking are therefore unsuitable for this system. For the patterning of defined levels in semiconductor fabrication, however, negative resist systems with the stated type of after treatment are needed.

Particularly with the conventional negative resists that can be developed by aqueous alkalis, the problem exists of what is known as swelling. Although in principle the exposed areas of resist are made insoluble toward the developer by the polymer cross-linking which takes place during the heating step, the marginal areas of the structures are problematic. In these areas, in fact, owing to a weaker light irradiation intensity and also to diffusion processes, fewer protons are available for cross-linking. As a result, cross-linking is unable to take place to the same extent as is the case in the center of the structures. Although the marginal areas are insoluble in the developer, they may nevertheless swell up in the course of development and falsify the profile of the structure. This can be attributed to the reduced extent of polymer cross-inking, as a result of which the structures in the marginal area are mechanically less stable than in the core area. Especially in the case of structures of continually reduced size, this is a great problem, since in this case the fraction of the marginal areas (edges) becomes ever greater in comparison to the actual volume of structure. Using conventional negative resist systems, therefore, faithful reproduction of very fine structures is very difficult, if not impossible, to achieve.

Conventional resist systems utilize only one single photoactive component for the actual patterning. Other additives are not aimed directly at the structurability, but instead merely compensate the disruptive lateral diffusion of the photoactive component. Published, European Patent Application EP 0 425 142 A, on the other hand, discloses a photoresist system wherein patterning takes place by combined production of acids and bases. In this way it is possible to convert a negative-working resist into a positive-working resist. This system, however, has the same disadvantages as the positive resist known from Published, Non-Prosecuted German Patent Application DE 42 26 464 A, namely high edge roughness and limited resolving power.

SUMMARY OF THE INVENTION

It is accordingly an object of the invention to provide a method for producing resist structures which overcomes the above-mentioned disadvantages of the prior art methods of this general type, in which the resist, developable by aqueous alkali, is not structured by cross-linking and hence an after-treatment is possible after the developing step, and which solves the problem of edge roughness and of limited resolution. Moreover, the process should be suitable for use both for optical lithography and with direct writing processes (using laser, electron or ion beams) and also with electron projection lithography (EPL) and ion projection lithography (IPL).

With the foregoing and other objects in view there is provided, in accordance with the invention, a process for producing negative resist structures. The process includes providing a substrate and applying a chemical amplification resist to the substrate. The chemical amplification resist contains a polymer that changes polarity when exposed to an acid and the ploymer includes carboxylic anhydride groups, a compound functioning as a thermoacid generator from which an acid is released by when exposed to a thermal treatment, a photoreactive compound functioning as a photobase generator from which a base is formed on exposure to light, X-rays, electron beams or ion beams, and a solvent. The chemical amplification resist is dried and then exposed to light, X-rays, electron beams or ion beams. The chemical amplification resist is first heated and then developed with an aqueous-alkaline developer solution. The chemical amplification resist is then siliconized from a liquid phase.

In the process according to the invention, the structures are produced not by direct siliconization but instead by a wet-chemical developing process taking place before the siliconizing. Following development, the predefined structures are treated with a siliconizing solution, giving all of the advantages of the CARL process (trough narrowing, high silicon content in the two-layer technique, large processing windows). In this way, the quality of the structure obtained is substantially better than in the prior art, in combination with a higher resolving power. With this process, the negative resist does not operate on the basis of chemical cross-linking and hence on the basis of prevention of detachment of the exposed areas, and, moreover, it does not exhibit the resolution-restricting phenomenon of swelling. Instead, a sharp increase occurs in the solubility of the unexposed areas. With this process, therefore, a negative-working variant of the CARL process is provided. A further advantage is that inexpensive resists or base polymers can be used.

In accordance with an added mode of the invention, there is the step of forming the polymer with at least one of the following acid-labile groups: tert-alkyl esters, tert-butoxycarbonyloxy, acetal, tetrahydrofuranyl, or tetrahydropyranyl.

In accordance with a further mode the invention, there is the mode of liberating a sulfonic acid from the thermo acid generator.

In accordance with another mode the invention, there is the mode of forming the thermoacid generator from at least one compound of a dialkyliodonium salt, a alkylaryliodonium salt, a diaryliodonium salt, a trialkylsulfonium salt of a sulfonate, a dialkylarylsulfonium salt of a sulfonate, a alkyldiarylsulfonium salt of a sulfonate, o-nitrobenzylsulfonate, a salt of a benzylthiolanium compound, a salt of a polyfluorinated butanesulfonate, and/or N-sulfonic esters.

In accordance with an additional mode of the invention, there is the step of forming an amine from the photobase generator. The photobase generator has at least one of the following compounds: O-acyloxime, a benzyloxycarbonylamide derivative, a formamide derivative, a diarylmethane-trialkylammonium salt, o-nitrobenzyloxycarbonylcyclohexylamine, 2,6-dinitrobenzyloxycarbonylcyclohexylamine, a nifedipine derivative, and/or polymer-bound photobase generators based on one of the aforementioned base precursors.

In accordance with a further added mode of the invention, there is the step of adding an additive to the chemical amplification resist being either a 9-anthracenemethanol acid or a 9-hydroxy-9-fluorenecarboxylic acid.

In accordance with a further additional mode of the invention, there is the step of irradiating the chemical amplification resist with UV light having a wavelength in a range of 1 to 400 nm.

In accordance with another further mode of the invention, there is the step of performing the siliconizing step using a compound containing amino groups.

In accordance with added mode of the invention, there is the step of carrying out a thermal treatment before, after or before and after performing the siliconizing step. During the siliconizing step, a compound containing amino groups in an organic solvent can be used.

In accordance with a further mode of the invention, there is the step of forming the chemical amplification resist with at least one additive.

In accordance with a concomitant mode of the invention, there is the step of providing the carboxylic anhydride groups in latent form.

Other features which are considered as characteristic for the invention are set forth in the appended claims.

Although the invention is described herein as embodied in a method for producing resist structures, it is nevertheless not intended to be limited to the details described, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

DESCRIPTION OF THE PREFERRED EMBODIMENT

In detail, the process according to the invention proceeds as follows. A resist is applied to a substrate to be patterned and is then dried; in this operation, the solvent evaporates. In the resulting solid resist film, targeted irradiation then produces a latent image of the desired structure, the exposed areas exhibiting a base produced from a photobase generator. Irradiation is carried out either optically with light or with X-rays with the assistance of a photomask, or directly using focused electrons or ions. In a heating step following the irradiation (a post-exposure bake (PEB)), the thermoacid generator is cleaved in the entire resist film and an acid is formed, i.e., a chemical compound which is more acidic than the matrix. The acid then catalyzes chemical reactions on the polymer that lead to the elimination of fragments of the molecule, thereby bringing about a change in the polarity (of the resist); in other words, a transition from hydrophobic to hydrophilic takes place. This is possible, however, only in areas where a sufficient amount of acid is available. In the exposed or irradiated areas, the acid is scavenged by the base produced beforehand, so that the polymer is unable to enter into any acid-catalyzed reactions. In the exposed areas, therefore, the polymer remains substantially unchanged; that is, it is insoluble in the developer. In the course of subsequent development, carried out by an aqueous-alkaline developer, therefore, only the unexposed areas are dissolved away, and in this way a negative image of the original structure is produced. Therefore, the substrate is bare at the unexposed areas, while the exposed areas are still protected by the solid resist film.

Following development, the patterned substrate is siliconized from a liquid phase, i.e., treated with a silicon-containing solution; this takes place either in the form of a dip siliconization or in a puddle apparatus. Siliconization, in the course of which silicon molecules are installed into the developed resist structures, as a result of a reaction with the carboxylic anhydride groups, gives the resist mask very high etching stability in relation to an oxygen plasma; at the same time, the siliconization allows lateral widening of the pre-defined structures (CARL principle). In the lithographic process under production conditions, this allows the processing window to be enlarged. It is important here that the developed resist structures do not contain any cross-linked polymer structures, so that the described after-treatment (in the sense of the CARL technology) can be successfully implemented.

The resist that is used in the process according to the invention contains a polymer that under acid catalysis is able to enter into chemical reactions. Used preferably for this purpose are functional groups, and specifically acid-labile groups, from which molecule fragments are eliminated. These are, advantageously, one or more of the following groups: tert-alkyl esters, tert-butoxycarbonyloxy, acetal, tetrahydrofuranyl, and tetrahydropyranyl. Preference is given here to a tert-butyl ester group.

The polymer further contains carboxylic anhydride groups suitable for the chemical attachment of the siliconizing agent; preference is given here to succinic anhydride groups. For this purpose it is, however, also possible to use the anhydride groups of copolymerized itaconic, acrylic or methacrylic anhydride and also anhydride groups present in latent form, formed for example by thermal treatment from carboxylic acids or carboxylic acid derivatives.

Advantageously, a sulfonic acid is liberated by the thermal treatment from the thermoacid generator present in the resist. The acid is preferably an organic sulfonic acid with an aromatic or aliphatic nature, particularly an acid from the following group: aromatic sulfonic acids substituted on the aromatic radical—in any position—by halogen atoms, nitro groups or aliphatic radicals (containing 1 to 5 carbon atoms); aliphatic sulfonic acids substituted on the aliphatic radical—in any position—by halogen atoms or nitro groups; aliphatic sulfonic acids containing polycyclic aliphatic groups, especially adamantyl groups and norbornyl groups.

As the thermoacid generator it is preferred to use at least one of the following compounds: dialkyl-, alkylaryl- or diaryliodonium salt and trialkyl-, dialkylaryl- or alkyldiarylsulfonium salt of a sulfonate (where alkyl=$C_1$ to $C_{12}$ and aryl=$C_6$ to $C_{18}$, unsubstituted or substituted by OH, $NO_2$, halogen, $C_1$ to $C_{12}$ alkyl or $C_1$ to $C_{12}$ O-alkyl); o-nitrobenzylsulfonate; salt of a benzylthiolanium compound, especially a 4-methoxybenzylthiolanium compound; salt of a polyfluorinated butanesulfonate, especially a nonafluorobutanesulfonate, such as 4-methoxybenzylthiolanium nonafluorobutanesulfonate; N-sulfonic esters, examples being N-phthalimide p-toluenesulfonic esters.

An amine is advantageously liberated by exposure or irradiation from the photobase generator that is present in the resist. The amine is preferably an organic aromatic or aliphatic amine. As photobase generators it is advantageous to use at least one of the following compounds: O-acyloxime, benzyloxycarbonylamide derivative, formamide derivative, diarylmethanetrialkylammonium salt, o-nitrobenzyloxycarbonylcyclohexylamine (o-nitrobenzyl N-cyclohexylcarbamate), 2,6-dinitrobenzyloxycarbonylcyclohexylamine, nifedipine derivative, such as N-methylnifedipine, and polymer-bound photobase generators based on one of the aforementioned base precursors.

Solvents used include known resist solvents, particularly at least one of the following compounds: 1-methoxy-2-propyl acetate, cyclohexanone, γ-butyrolactone, and ethyl lactate. Preference is given here to 1-methoxy-2-propyl acetate.

The resist contains, if desired, one or more additives that are able to improve resist properties, such as storage stability, service life, and film forming. It is also possible to use additives which act as solubilizers, serve to adapt the exposure wavelength or absorption wavelength, influence the exposure dose, or are able to change properties which improve the process or product. Particularly preferred additives are 9-anthracenemethanol and 9-hydroxy-9-fluorenecarboxylic acid. These compounds act as sensitizers; that is, they absorb energy on exposure and pass it on to the photobase generator, as the result of which the latter can be cleaved in a higher quantum yield than would be the case without addition of the additive.

The resist generally has the following composition (pbw= parts by weight), the individual fractions adding up to 100: from 2 to 15 pbw of polymer, from 0.06 to 1.5 pbw of thermoacid generator, from 0.06 to 1.5 pbw of photobase generator, from 85 to 98 pbw of solvent, and from 0 to 1.5 pbw of additives.

The resist is applied to the substrate by methods that are known per se, such as by spin coating. The resist is generally dried at a temperature from about 60 to 160° C. The resist is preferably irradiated using UV light with a wavelength λ of from 1 to 400 nm. Subsequent thermal treatment, i.e., the heating of the resist, takes place in general at a temperature from about 80 to 250° C. The temperature during the heating step is above the temperature during drying. The resist is developed using aqueous-alkaline developer solutions that are known per se, especially developers containing tetramethyl- or tetraethylammonium hydroxide.

Siliconization takes place preferably using an organic compound that contains amino groups or using a mixture of such compounds, and is carried out from the liquid phase. In general, the siliconizing agent is in solution in an organic solvent, especially in an alcohol, such as ethanol, 2-propanol, and 2-hexanol; the alkyl may also contain water, in particular from 0.5 to 30% by weight. The siliconizing agent is preferably a mixture of diaminooligosiloxanes having from 4 to 20 silicon atoms per molecule, especially a diaminooligodimethylsiloxane. A thermal treatment may also be carried out before and/or after the siliconization of the resist. This has a positive effect on the profile of the resist structure, since moisture remaining following development is removed from the resist film, or residual solvent remaining after the siliconization. For any subsequent dry etching, a thermal treatment following siliconization is particularly advantageous, since in this way it is possible to avoid any difference in the lateral width of isolated lines and valleys.

The invention will be illustrated in detail with reference to examples.

EXAMPLE 1

The Preparation of a Photoresist and the Coating of a Substrate (pbw=parts by weight)

A resist is prepared containing the following components: 7.52 pbw of a terpolymer, 0.08 pbw of thermoacid generator, 0.4 pbw of photobase generator, and 92 pbw of solvent. The terpolymer is obtained by free-radical copolymerization of maleic anhydride, tert-butyl methacrylate, and allylsilane (molar weight: approximately 20,000 g/mol). The thermoacid generator is 4-methoxybenzylthiolanium 2H-nonafluorobutanesulfonate and the photobase generator is o-nitrobenzyl N-cyclohexylcarbamate; the solvent used is 1-methoxy-2-propyl acetate.

This resist is spin coated at a speed of 2,000/min onto a silicon wafer coated with a heated layer (235° C./90 s, hot plate) 0.5 µm thick of a commercial novolak (duration of spin coating: 20 s) and is then dried on a hotplate at 100° C. for 60 s. The layer thickness of the top resist present on the bottom resist is approximately 200 nm.

EXAMPLE 2

The Exposure and Development of the Resist

The top resist in accordance with Example 1 is exposed to UV radiation at 248 nm through a gray wedge mask (multi-density resolution target/Ditric Optics) on a mask aligner with vacuum contact exposure (MJB 3/Süss KG with UV-M interference filter/Schott) and then heat treated (PEB) on a hotplate at 150° C. for 60 s. The tert-butyl ester, catalyzed by the acid formed, is cleaved. Development (60 s) in a vessel thermostated at 23° C. using a commercial developer dissolves away the unexposed areas of the resist, leaving a negative image of the mask. Since the mask contains regions with different degrees of transmission, it is possible to determine the dose at which the resist is fully developed; that is, when no remaining thickness of resist layer can be measured in the unexposed areas (Dp(0) dose). Evaluation using a contrast plot for the abovementioned process conditions gives a value for Dp(0) of 50 mJ/cm$^2$. The contrast, i.e., the slope of the plot at the point of inflection, is comparable with contrast values for commercial resists.

This example therefore illustrates the usefulness in principle of the resist system for lithographic applications.

EXAMPLE 3

The Patterning of the Resist

A wafer coated in accordance with Example 1 is exposed through a mask containing 0.15 µm line/bridge structures, using a projection exposure apparatus with a numerical aperture of 0.6, at a wavelength of 248 nm. Following exposure, the wafer is heat treated (PEB) on a hot plate at 150° C. for 60 s. Following development with a commercial tetramethylammonium hydroxide developer (duration: 60 s) a negative image of the mask is obtained in the resist, with the 0.15 µm structures being imaged in such a way that they retain their dimension. Thereafter the wafer is coated over at room temperature with a solution consisting of 2% by weight of bisaminooligodimethylsiloxane and 98% by weight of hexanol. After 40 s, the wafer is washed with isopropanol and then dried in a stream of air. The structures siliconized and widened in this way have 0.20 µm bridges and 0.10 µm valleys. In a plasma-etching reactor, the siliconized top resist structure is subsequently transferred into the underlying bottom resist by an anisotropic oxygen plasma. The structures obtained in the procedure have vertical sidewalls and also 0.20 µm bridges and 0.10 µm valleys.

We claim:

1. A process for producing negative resist structures, which comprises the steps of:

providing a substrate;

applying a chemical amplification resist to the substrate, the chemical amplification resist containing:
a polymer which changes polarity when exposed to an acid, and the polymer including carboxylic anhydride groups;
a compound functioning as a thermoacid generator from which an acid is released when exposed to a thermal treatment;
a photoreactive compound functioning as a photobase generator from which a base is formed upon exposure to one of light, X-rays, electron beams and ion beams; and
a solvent;

drying the chemical amplification resist;

exposing the chemical amplification resist to one of light, X-rays, electron beams and ion beams;

heating the chemical amplification resist;

developing the chemical amplification resist with an aqueous-alkaline developer solution; and siliconizing the chemical amplification resist from a liquid phase.

2. The process according to claim 1, which comprises forming the polymer with at least one acid-labile group selected from the group consisting of tert-alkyl esters, tert-butoxycarbonyloxy, acetal, tetrahydrofuranyl, and tetrahydropyranyl.

3. The process according to claim 1, which comprises liberating a sulfonic acid from the thermo acid generator.

4. The process according to claim 1, which comprises forming the thermoacid generator from at least one compound selected from the group consisting of a dialkyliodonium salt, a alkylaryliodonium salt, a diaryliodonium salt, a trialkylsulfonium salt of a sulfonate, a dialkylarylsulfonium salt of a sulfonate, a alkyldiarylsulfonium salt of a sulfonate, o-nitrobenzylsulfonate, a salt of a benzylthiolanium compound, a salt of a polyfluorinated butanesulfonate, and N-sulfonic esters.

5. The process according to claim 1, which comprises forming an amine from the photobase generator.

6. The process according to claim 1, which comprises forming the photobase generator from at least one compound selected from the group consisting of O-acyloxime, a benzyloxycarbonylamide derivative, a formamide derivative, a diarylmethanetrialkylammonium salt, o-nitrobenzyloxycarbonylcyclohexylamine, 2,6-dinitrobenzyloxycarbonylcyclohexylamine, a nifedipine derivative, and polymer-bound photobase generators based on one of the aforementioned base precursors.

7. The process according to claim 1, which comprises adding an additive to the chemical amplification resist and selecting the additive from the group consisting of 9-anthracenemethanol acid and 9-hydroxy-9-fluorenecarboxylic acid.

8. The process according to claim 1, which comprises irradiating the chemical amplification resist with UV light having a wavelength in a range of 1 to 400 nm.

9. The process according to claim 1, which comprises performing the siliconizing step using a compound containing amino groups.

10. The process according to claim 1, which comprises carrying out a thermal treatment before performing the siliconizing step.

11. The process according to claim 1, which comprises performing the siliconizing step using a compound containing amino groups in an organic solvent.

12. The process according to claim 1, which comprises carrying out a thermal treatment after performing the siliconizing step.

13. The process according to claim 1, which comprises carrying out a thermal treatment before and after performing the siliconizing step.

14. The process according to claim 1, which comprises forming the chemical amplification resist with at least one additive.

15. The process according to claim 1, which comprises providing the carboxylic anhydride groups in latent form.

* * * * *